(12) United States Patent
Selen et al.

(10) Patent No.: US 7,553,516 B2
(45) Date of Patent: Jun. 30, 2009

(54) SYSTEM AND METHOD OF REDUCING PARTICLE CONTAMINATION OF SEMICONDUCTOR SUBSTRATES

(75) Inventors: Louis J. M. Selen, Eindhoven (NL); Eric A. H. Timmermans, Portland, OR (US); Gerrit ten Bolscher, Tempe, AZ (US)

(73) Assignee: ASM International N.V. (NL)

( * ) Notice: Subject to any disclaimer, the term of this patent is extended or adjusted under 35 U.S.C. 154(b) by 542 days.

(21) Appl. No.: 11/305,826

(22) Filed: Dec. 16, 2005

(65) Prior Publication Data
US 2007/0141851 A1 Jun. 21, 2007

(51) Int. Cl.
*C23C 16/00* (2006.01)
(52) U.S. Cl. .............. 427/248.1; 118/715; 118/728
(58) Field of Classification Search .............. 427/248.1; 118/715, 728
See application file for complete search history.

(56) References Cited

U.S. PATENT DOCUMENTS

| | | | |
|---|---|---|---|
| 4,262,631 A | 4/1981 | Kubacki |
| 4,277,320 A | 7/1981 | Beguwala et al. |
| 4,298,629 A | 11/1981 | Nozaki et al. |
| 4,363,828 A | 12/1982 | Brodsky et al. |
| 4,389,973 A | 6/1983 | Suntola et al. |
| 4,495,218 A | 1/1985 | Azuma et al. |
| 4,570,328 A | 2/1986 | Price et al. |
| 4,585,671 A | 4/1986 | Kitagawa et al. |
| 4,684,542 A | 8/1987 | Jasinski et al. |
| 4,699,805 A | 10/1987 | Seelbach et al. |
| 4,715,937 A | 12/1987 | Moslehi et al. |
| 4,834,020 A | 5/1989 | Bartholomew |
| 4,851,095 A | 7/1989 | Scobey et al. |
| 4,935,661 A | 6/1990 | Heinecke et al. |
| 4,986,715 A | 1/1991 | Asakawa |
| 5,178,639 A | 1/1993 | Nishi |
| 5,227,329 A | 7/1993 | Kobayashi et al. |

(Continued)

FOREIGN PATENT DOCUMENTS

EP 0442490 A1 8/1991

(Continued)

OTHER PUBLICATIONS

Hiltunen et al., "Nitrides of Titanium, Niobium, Tantalum and Molybdenum Grown as Thin Films by the Atomic Layer Epitaxy Method," Thin Solid Films, 166 (1988) 149-154.

(Continued)

*Primary Examiner*—Roberts P Culbert
(74) *Attorney, Agent, or Firm*—Knobbe, Martens, Olson & Bear LLP

(57) ABSTRACT

Particle contamination of semiconductor substrates due to particles coming off of wafer boat rods is reduced. A gas flow is established with the boat rods downstream of the substrates, to blow particles from the boat rods away from the substrates. The boat rods can also be placed upstream of the substrates in the gas flow, and a flow deflector is used to minimize the flow of gas contacting the boat rods, to reduce the amount of particles being blown off the rods. In addition, the gas flow can be below a rate at which particle generation is likely or can be at a sufficiently high rate to minimize the possibility of particles settling on the substrates.

22 Claims, 6 Drawing Sheets

U.S. PATENT DOCUMENTS

| | | | |
|---|---|---|---|
| 5,254,170 | A | 10/1993 | Devilbiss et al. |
| 5,356,673 | A | 10/1994 | Schmitt et al. |
| 5,387,265 | A | 2/1995 | Kakizaki et al. |
| 5,389,398 | A | 2/1995 | Suzuki et al. |
| 5,389,570 | A | 2/1995 | Shiozawa |
| 5,407,449 | A | 4/1995 | Zinger |
| 5,453,858 | A | 9/1995 | Yamazaki |
| 5,464,313 | A | 11/1995 | Ohsawa |
| 5,549,473 | A | 8/1996 | Valentian |
| 5,562,383 | A | 10/1996 | Iwai et al. |
| 5,607,724 | A | 3/1997 | Beinglass et al. |
| 5,614,257 | A | 3/1997 | Beinglass et al. |
| 5,648,293 | A | 7/1997 | Hayama et al. |
| 5,656,531 | A | 8/1997 | Thakur et al. |
| 5,695,819 | A | 12/1997 | Beinglass et al. |
| 5,698,771 | A | 12/1997 | Shields et al. |
| 5,700,520 | A | 12/1997 | Beinglass et al. |
| 5,769,950 | A | 6/1998 | Takasu et al. |
| 5,786,027 | A | 7/1998 | Rolfson |
| 5,788,448 | A | 8/1998 | Wakamori et al. |
| 5,789,030 | A | 8/1998 | Rolfson |
| 5,837,580 | A | 11/1998 | Thakur et al. |
| 5,874,129 | A | 2/1999 | Beinglass et al. |
| 5,876,797 | A | 3/1999 | Beinglass et al. |
| 5,885,869 | A | 3/1999 | Turner et al. |
| 5,907,792 | A | 5/1999 | Droopad et al. |
| 5,916,365 | A | 6/1999 | Sherman |
| 6,015,590 | A | 1/2000 | Suntola et al. |
| 6,027,705 | A | 2/2000 | Kitsuno et al. |
| 6,083,810 | A | 7/2000 | Obeng et al. |
| 6,136,654 | A | 10/2000 | Kraft et al. |
| 6,143,083 | A | 11/2000 | Yonemitsu et al. |
| 6,159,828 | A | 12/2000 | Ping et al. |
| 6,171,662 | B1 | 1/2001 | Nakao |
| 6,197,669 | B1 | 3/2001 | Twu et al. |
| 6,197,694 | B1 | 3/2001 | Beinglass |
| 6,200,893 | B1 | 3/2001 | Sneh |
| 6,203,613 | B1 | 3/2001 | Gates et al. |
| 6,228,181 | B1 | 5/2001 | Yamamoto et al. |
| 6,318,944 | B1 | 11/2001 | Shimeno et al. |
| 6,326,311 | B1 | 12/2001 | Ueda et al. |
| 6,391,803 | B1 | 5/2002 | Kim et al. |
| 6,455,892 | B1 | 9/2002 | Okuno et al. |
| 6,468,924 | B2 | 10/2002 | Lee et al. |
| 6,481,945 | B1 | 11/2002 | Hasper et al. |
| 6,528,530 | B2 | 3/2003 | Zeitlin et al. |
| 6,537,910 | B1 | 3/2003 | Burke et al. |
| 6,540,465 | B2 | 4/2003 | Tometsuka |
| 6,613,695 | B2 | 9/2003 | Pomarede et al. |
| 6,638,879 | B2 | 10/2003 | Hsieh et al. |
| 6,663,332 | B1 | 12/2003 | Sluijk et al. |
| 2002/0037210 | A1 | 3/2002 | Matsunaga et al. |
| 2002/0098627 | A1 | 7/2002 | Pomarede et al. |
| 2002/0168868 | A1 | 11/2002 | Todd |
| 2002/0197831 | A1 | 12/2002 | Todd et al. |
| 2003/0022528 | A1 | 1/2003 | Todd |
| 2003/0082300 | A1 | 5/2003 | Todd et al. |
| 2003/0111013 | A1 | 6/2003 | Oosterlaken et al. |
| 2003/0148605 | A1 | 8/2003 | Shimogaki et al. |

FOREIGN PATENT DOCUMENTS

| | | | |
|---|---|---|---|
| EP | 0526779 | A1 | 2/1993 |
| JP | 59078919 | A | 1/1982 |
| JP | 57209810 | A | 12/1982 |
| JP | 59078918 | A | 5/1984 |
| JP | 60043485 | A | 3/1985 |
| JP | S60-43485 | | 3/1985 |
| JP | 61153277 | A | 7/1986 |
| JP | 62076612 | A | 4/1987 |
| JP | 63003414 | A | 1/1988 |
| JP | 63003463 | A | 1/1988 |
| JP | 01217956 | A | 8/1989 |
| JP | 01268064 | A | 10/1989 |
| JP | 02155225 | A | 6/1990 |
| JP | H 02-155225 | | 6/1990 |
| JP | 03091239 | A | 4/1991 |
| JP | H3-91239 | | 4/1991 |
| JP | 03185817 | A | 8/1991 |
| JP | 03187215 | A | 8/1991 |
| JP | H3-185817 | | 8/1991 |
| JP | H3-187215 | | 8/1991 |
| JP | 03292741 | A | 12/1991 |
| JP | 04323834 | A | 11/1992 |
| JP | 05021378 | A | 1/1993 |
| JP | 05062911 | A | 3/1993 |
| JP | H5-62911 | | 3/1993 |
| JP | 07249618 | A | 9/1995 |
| JP | 08242006 | A | 9/1996 |
| JP | 2001244322 | A * | 9/2001 |
| NL | 1005410 | | 2/1997 |
| WO | WO 98/36444 | | 8/1998 |

OTHER PUBLICATIONS

Hillman et al., "Properties of LPCVD TiN Barrier Layers," Microelectronic Engineering 19 (1992) 375-378.

Hiramatsu et al., Formation of TiN Films with Low Cl Concentration by Pulsed Plasma Chemical Vapor Deposition, J. Vac. Sci. Technol. A, 14(3) May/Jun. 1996.

Ikoma et al., Growth of Si/3C-SiC/Si(100) hetrostructures by pulsed supersonic free jets, Applied Physics Letters, vol. 75, No. 25, pp. 3977-3979, Dec. 1999.

Iyer, R. Suryanarayanan et al., "A Process Method of Silicon Nitride Atomic Layer Cyclic Deposition," Semicon Taiwan 2001, pp. 17-25.

Nakano et al., "Digital Chemical Vapor Deposition of $SiO_2$," Appl Phys. Lett. 57 (11) Sep. 1990, pp. 1096-1098.

Ramanuja, et al., "Synthesis and characterization of low pressure chemically vapor deposited titanium nitride films using $TiCl_4$ and $NH_3$," Materials Letters 57 (2002) 261-269.

Sakaue et al., Digital Chemical Vapor Deposition of $SiO_2$ Using a Repetitive Reaction of Triethylsilane/Hydrogen and Oxidation, Japanese Journal of Applied Materials, vol. 30, No. 1B, Jan. 1990, pp. L 124-L 127.

* cited by examiner

SYSTEM AND METHOD OF REDUCING PARTICLE CONTAMINATION OF SEMICONDUCTOR SUBSTRATES

FIELD OF THE INVENTION

This invention relates generally to semiconductor substrate processing and, more particularly, to the processing of a batch of substrates accommodated in a wafer boat in a furnace.

BACKGROUND OF THE INVENTION

To process a batch of wafers in a furnace, the wafers can be loaded into a wafer boat in a vertically stacked and spaced manner. The wafer boat can have the design shown in FIG. 1. The wafer boat is indicated in its entirety by reference numeral 100. The wafer boat 100 is typically formed of quartz but can also be formed of other materials, such as silicon carbide or other ceramic materials. Three or more vertically-extending rods 102, 103 and 104 are each attached at their upper and lower ends, respectively, to a top plate 105 and a bottom plate 106. Vertically spaced recesses 110 are formed at similar heights in each of the rods 102, 103, 104 with the remaining material of the rods 102, 103, 104 forming ridges which can function as wafer or substrate supports. The corresponding recesses 110 at the same height in each of the wafer rods 102, 103, 104 collectively form an accommodation for a wafer in which the wafer is supported at an edge portion thereof by the wafer support ridges. Wafers are loaded into and unloaded out of the accommodations from an open side 107, where a robot can access the wafers without any rods interfering with the movement of wafers into or out of the wafer accommodations.

After loading wafers into the boat 100, the boat 100 is loaded into the process chamber of a hot furnace for processing in the furnace. After processing in the furnace is completed, the hot wafer boat is unloaded from the furnace. After a cool-down period, the wafers are unloaded from the wafer boat by a wafer handling robot.

An effect that can occur during wafer processing, which includes the period during which wafers are handled before and after being processed in the process chamber, is the formation of particles on the wafers. For example, during a low pressure chemical vapor deposition (LPCVD) process to form silicon nitride, particle formation occurs on semiconductor wafers held in a quartz boat having a design such as that shown in FIG. 1. It will be appreciated that particle formation on the wafers is undesirable because the particles can detrimentally affect the performance of semiconductor devices formed on the wafers.

Consequently, there is a need for a substrate processing systems and methods that minimize particle formation during semiconductor substrate processing.

SUMMARY OF THE INVENTION

According to one aspect of the invention, a furnace system is provided for processing wafers. The system comprises a wafer boat comprising three or more vertically-extending boat rods and configured to accommodate and vertically space apart a plurality of wafers. One or more of the boat rods are back boat rods disposed on a side of the wafer boat opposite an open side of the wafer boat. The system also comprises a vertical furnace configured to process a wafer boat filled with the wafers. The system further comprises a wafer handling station for loading the wafers into the wafer boat or for removing the wafers from the wafer boat. The wafer handling station comprises a gas flow source configured to provide a gas flow to the wafer boat such that gas directed at the wafers accommodated in the wafer boat avoids direct contact with any boat rod positioned between the gas flow source and the wafers.

According to another aspect of the invention, a furnace system for processing wafers is provided. The furnace system comprises a wafer boat comprising three or more vertically-extending boat rods and configured to accommodate and vertically space apart a plurality of the wafers. The system also comprises a vertical furnace configured to accommodate a wafer boat filled with the wafers. The system further comprises a wafer handling station for wafer loading of the wafer boat. The wafer handling station is provided with a gas flow source configured to provide a gas flow to the wafer boat. A controller is configured to maintain a velocity of the gas at higher than about 0.6 m/s or lower than about 0.1 m/s.

According to yet another aspect of the invention, a furnace system for processing substrates is provided. The furnace system comprises a wafer boat comprising three or more vertically oriented boat rods. The boat rods are provided with vertically spaced recesses at a plurality of similar heights. The recesses define a plurality of vertically spaced substrate accommodations. The system also comprises a vertical furnace configured to process a wafer boat filled with the substrates. The system further comprises a substrate handling station configured to load substrates into the wafer boat or to remove substrates from the wafer boat. The substrate handling station is provided with a gas flow source to provide a gas flow to the wafer boat. The substrate handling station is further configured to maintain a gas flow to a boat rod positioned between the gas flow source and the substrate at a velocity of about 0.6 m/s or higher According to another aspect of the invention, a wafer handling system is provided for loading wafers into or unloading wafers out of a wafer boat. The wafer boat has an open side allowing movement of wafers into or out of the wafer boat and also has one or more back boat rods on a side of the wafer boat opposite the open side. The back boat rods have a backside opposite the open side. The wafer handling system comprises a gas flow source configured to direct a gas flow to the wafer boat such that the gas flow avoids direct contact with the backside of the one or more back boat rods.

According to yet another aspect of the invention, a method is provided for semiconductor processing. The method comprises providing a wafer boat holding a plurality of substrates. The wafer boat has an open side for loading or unloading substrates from the wafer boat and also has a back boat rod opposite the open side. The back boat rod has a backside on a side of the boat rod opposite the open side. The method further comprises flowing gas to the wafer boat holding the plurality of substrates. The gas flow avoids directly contacting the backside of the back boat rod.

According to another aspect of the invention, a method is provided for semiconductor processing. The method comprises providing a wafer boat holding a plurality of substrates in a wafer handling station for loading wafers into or unloading wafers from the wafer boat. Gas is flowed to the wafer boat in the wafer handling station. The velocity of the gas is maintained at higher than about 0.6 m/s or lower than about 0.1 m/s

BRIEF DESCRIPTION OF THE DRAWINGS

The invention will be better understood from the detailed description of the preferred embodiments and from the appended drawings, which are meant to illustrate and not to limit the invention and wherein like numerals refer to like parts throughout.

DETAILED DESCRIPTION OF THE PREFERRED EMBODIMENTS

Figure 2:
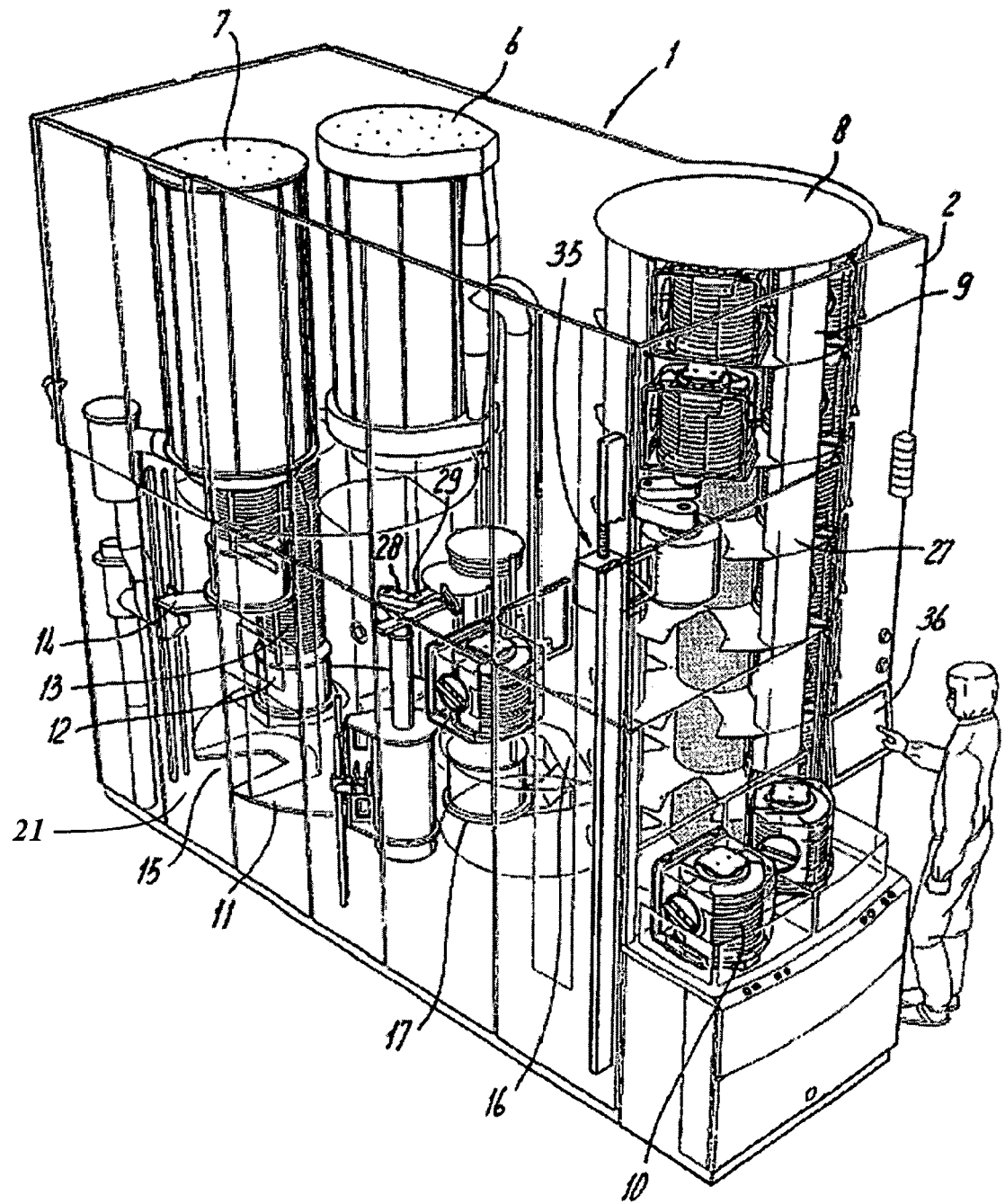
FIG. 2 shows, diagrammatically, a partially exposed, perspective view of an exemplary furnace system.
Figure 3:
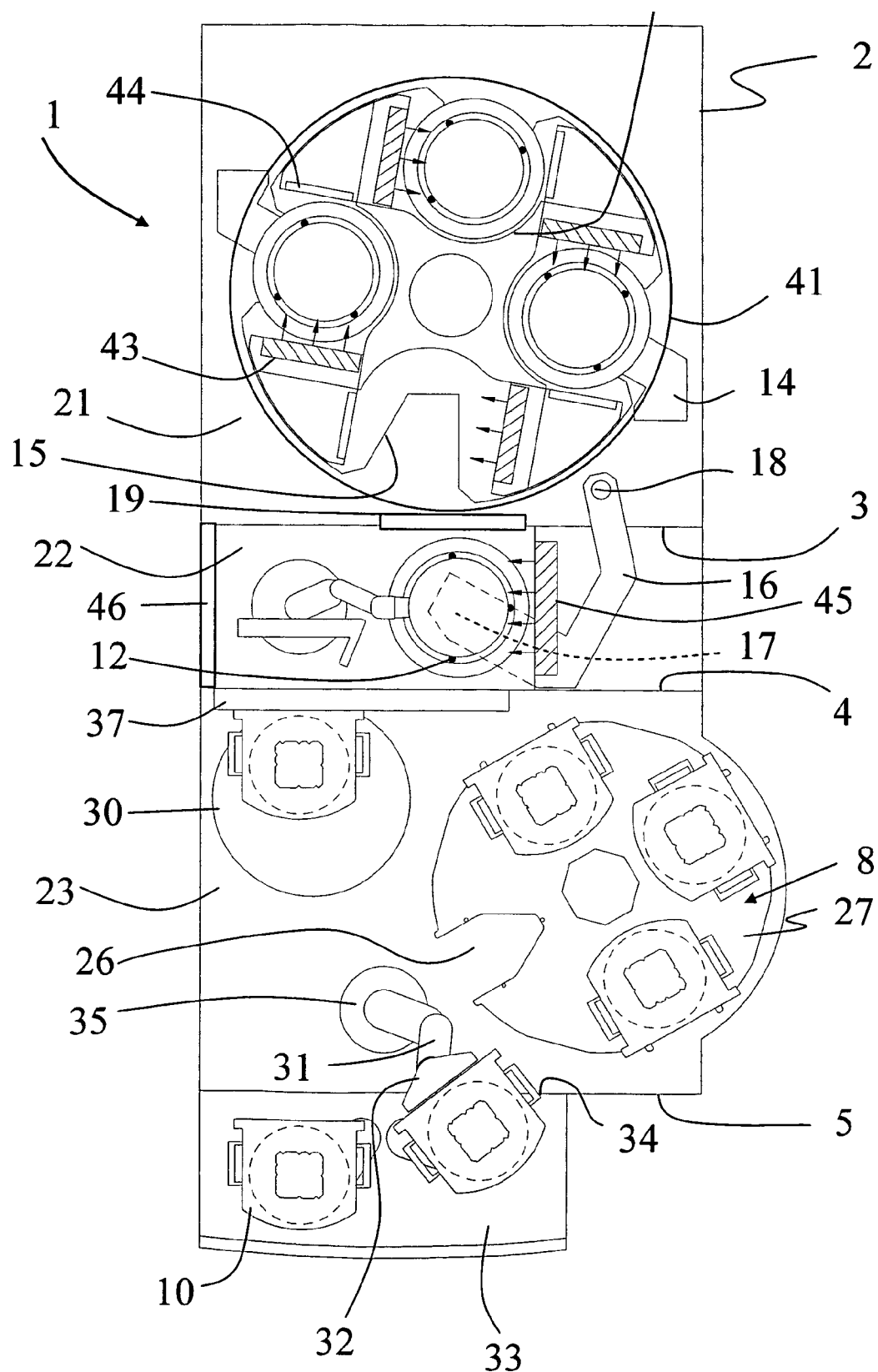
FIG. 3 shows, diagrammatically, a plan view of the furnace system of FIG. 2.

To better understand the particle formation problem, particle formation was investigated on wafers in an exemplary furnace system, commercially available under the trade name A412™ from ASM International N.V. of Bilthoven, The Netherlands. With reference to FIGS. 2 and 3, the furnace system is indicated in its entirety by 1. The system 1 comprises a housing 2 and is generally installed in a so-called "clean room". In addition to the outer housing 2, including a front partition 5, inner partitions 3, 4 are also present, as can be seen in particular in FIG. 3. The outer housing 2 delimits, with the inner partition 3, a reactor chamber 21. A wafer or substrate handling chamber 22 containing a wafer handling station is delimited by the outer housing 2 and the inner partitions 3, 4. A cassette handling chamber 23 is delimited between partitions 4 and 5 and the housing 2. Extending beyond the housing 2 is an introduction station or platform 33.

Figure 1:
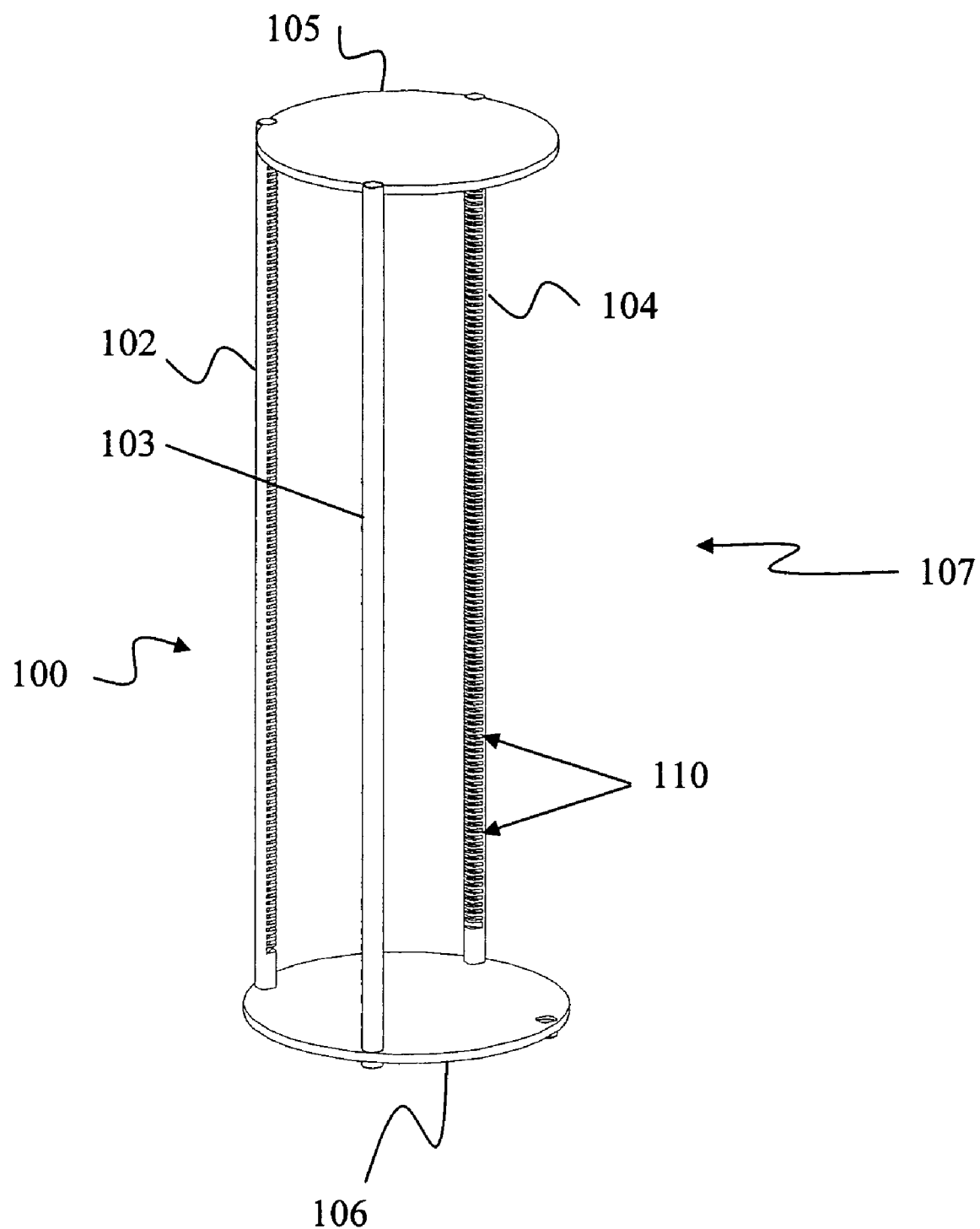
FIG. 1 is a perspective view of a prior art wafer boat.

As best seen in FIG. 2, two reactors, which in this case comprise furnaces 6 and 7, are arranged in the upper part of the reactor chamber 21. The furnaces 6, 7 are positioned vertically and wafer boats, indicated by 12, filled with wafers 13, are introduced into the furnaces 6 and 7 in the vertical direction from below. The wafer boats 12 can be similar in design to the wafer boat 100 illustrated in FIG. 1. The wafer boats 12 preferably can accommodate 50 or more and, more preferably, 100 or more substrates. To introduce a wafer boat 12 into a furnace 6, 7, each furnace has an insertion arm 14, which is movable in the vertical direction. Note that only one insertion arm 14 can be seen in FIG. 2. The wafer boat 12 is positioned on an insulating plug, which is in turn supported on a metal door plate, not indicated in more detail.

In the reactor chamber 21, a rotary platform 11, provided with cut-outs 15, is fitted. The cut-outs 15 are shaped such that, if the cut-outs 15 have been brought in the correct position, the arm 14 is able to move up and down through the cut-outs 15. On the other hand, the diameter of the metal door plate is such that the door plate is larger than the cut-out 15 in platform 11, so that when the arm 14 moves downwards from the position shown in FIG. 2, the door plate can be placed on rotary platform 11 and can be removed therefrom again in a reverse operation.

The rotary platform 11 comprises four compartments for accommodating a wafer boat, the compartments delimited by an outer wall 41, an internal shield 42, High Efficiency Particulate Air (HEPA) filter units 43 and gas recirculation plenums 44. Gas is circulated in each compartment from the HEPA filter unit 43 to the gas recirculation plenum 44. The circulation of filtered gas ensures a particle free environment in each compartment and also removes heat from the reactor chamber 21 that is released during unloading and cool-down of hot wafer boats 12. To this end, each plenum 44 also comprises a heat exchanger to withdraw heat from the circulating gas. The outer wall 41 is provided with an opening, not shown, corresponding with an opening 19 in the inner partition 3 to allow the placement of wafer boat 12 on the rotary platform 11 and openings, not shown, for the vertical movement of arms 14.

The wafers 13 are supplied in (transport) cassettes 10 and placed on an introduction station 33, and are then transported from the introduction station 33 to a store 8 through a closable opening 34 with the aid of a cassette transport arm 31. The cassette transport arm 31 is provided with a bearing surface 32 which has dimensions smaller than those of a series of cut-outs 26 in rotary platforms 27 of the store 8. A number of such rotary platforms 27 are provided one above the other in the vertical direction in the store 8. The cassette transport arm 31 is movable in the vertical direction with the aid of a vertical lift 35. The arm 31 is mounted such that said arm is not only able to pick up/remove cassettes 10 from/to the introduction station 33 to/from the store 8, but such that it is also possible to move cassettes 10 from/to the store 8 to/from a rotary cassette platform 30 within the cassette handling chamber 23. The rotary cassette platform 30 is constructed such that on rotation a cassette 10 is placed against the inner partition 4 where an opening 37 has been made so that, after opening the cassette 10, wafers can be taken one by one from the cassette 10 concerned with the aid of a wafer handling robot 24 (within the wafer handling chamber 22) and can be placed in the wafer boat 12 located in the wafer handling chamber 22. The wafer boat or rack 12 is supported by a hinged boat arm 16 which is provided with a bearing surface 17 at its end, the dimensions of which are once again somewhat smaller than those of the cut-outs 15. This boat arm 16 is able to move with the wafer boat 12 through the closable opening 19 in the inner partition 3. The closure 19 is provided to close off the reactor chamber 21 from the wafer handling chamber 22 when desired. The wafer handling chamber 22 is provided with a HEPA filter unit 45 and a gas recirculation plenum 46 in order to establish a flow of filtered gas in that chamber.

The treatment of wafers can be carried out as discussed below.

An operator, shown schematically in FIG. 2, loads the store 8 by introducing a number of cassettes 10 and performing control operations on a control panel 36. Each of the cassettes 10 is transferred from the introduction station 33 with the aid of the cassette transport arm 31 into the storage compartments 9 made for these cassettes in the store 8. The cassettes 10 concerned are then removed from the store 8 by the cassette transport arm 31 and placed on the rotary cassette platform 30. The cassettes 10 are rotated on the rotary cassette platform 30 and placed against the partition 4. After opening a cassette 10, with the aid of wafer handling robot 24, the wafers are removed wafer-by-wafer and placed into a wafer boat 12 disposed on the boat swing arm 16. After the wafer boat 12 has been filled with wafers 13 in the wafer handling chamber 22, the opening 19, which was closed up to this time, is opened and the filled wafer boat 12 is placed on the rotary boat platform 11 by the hinged arm 16. The rotary platform 11 then moves one position to place the wafer boat 12 below reactor 6 or 7. Then the wafer boat 12 is lifted into the reactor tube 6 or 7 for processing by the arm 14. After processing, the wafer boat 12 is lowered again from the reactor 6 or 7 down to the level of the rotary boat platform 11. After a cool-down period on the platform 11 sufficiently long to cool the wafer boat 22 to a desired temperature, the wafer boat 12 is placed at the opening 19 by rotation of the platform 11, and is transferred to the wafer handling chamber 22 through the opening 19 by the boat swing arm 17. Then the processed wafers are removed from the wafer boat by wafer handling robot 24.

FIG. 3 shows in more detail the orientation of the boat 12 in the wafer handling chamber 22. After processing, it was found that the wafers often exhibited streak-like patterns of high particle density. When the boat 12 is similar in design to the boat 100 of FIG. 1, the streaks start from the parts of the edges of wafers which are held in the recess in the rod of boat 12, opposite the open side of the wafer boat 12 (e.g., corresponding to the rod 102 of FIG. 1), and extend inwardly over the wafer surfaces through the center parts of the wafer surfaces and on to the opposite edge portions of the wafers, on the open side of the wafer boat. Hereinafter, a boat rod opposite the open side, e.g., the boat rod 102 in FIG. 1, will be referred to as a back rod and boat rods at the sides of the wafer boat, e.g., boat rods 103 and 104 in FIG. 1, will be referred to as side rods. It was found that no significant particle formation phenomena occurred on the portions of the wafer that were held by recesses in the side rods 103, 104.

Without being bound by theory, it is believed that the particles are simply blown-off of a boat rod and transported to a volume above an interior part of a wafer surface by the gas flow, where gravity causes some particles to settle on the wafer's surface. The source of particles is presumably the film material that is deposited on boat surfaces during a deposition process. In each process cycle, the boat goes through a temperature cycle from room temperature to process temperature (e.g., 750° C.) and back to room temperature again. Through differences in the coefficient of thermal expansion (CTE) between the deposited film and the boat material (e.g., quartz), stresses can occur which can give rise to cracking and flaking-off of the deposited film from the surfaces of the boat. Thus, while the occurrence of particles on wafer surfaces is conventionally referred to as particle formation, it has been found that many of the particles are actually preexisting material or particles that have been blown of from boat rods and that have settled onto the wafers. The conventional terminology is retained herein.

Preferred embodiments of the invention advantageously minimize particle formation on a substrate surface, e.g., wafer surface, by minimizing the blowing off of material from wafer boat rods onto the substrate surface and/or by minimizing the settling of particles on the substrate surface. In some embodiments, a gas flow is established to blow material from boat rods away from, rather than towards, the interior part of the substrate surface. Advantageously, any blown off material is directed away from the substrate surface. In other embodiments, the gas flow is in the direction from a boat rod, preferably a back boat rod, to an interior of the substrate surface, but one or more gas flow deflectors impede or redirect the gas flow so that the gas flow does not or only minimally contact the boat rod. Advantageously, the blowing off of material from the boat rods is minimized, thereby minimizing the number of particles which may fall onto the substrate surface. In other embodiments, the gas flow is again in the direction from a boat rod, preferably a back boat rod, to an interior of the substrate surface, but the gas flow has a sufficiently high velocity to prevent any particles from falling onto the surface of the substrate, or a sufficiently low velocity to prevent the blowing off of particles in the first instance. Advantageously, the number of particles settling on the substrate surface is minimized.

Figure 4A:
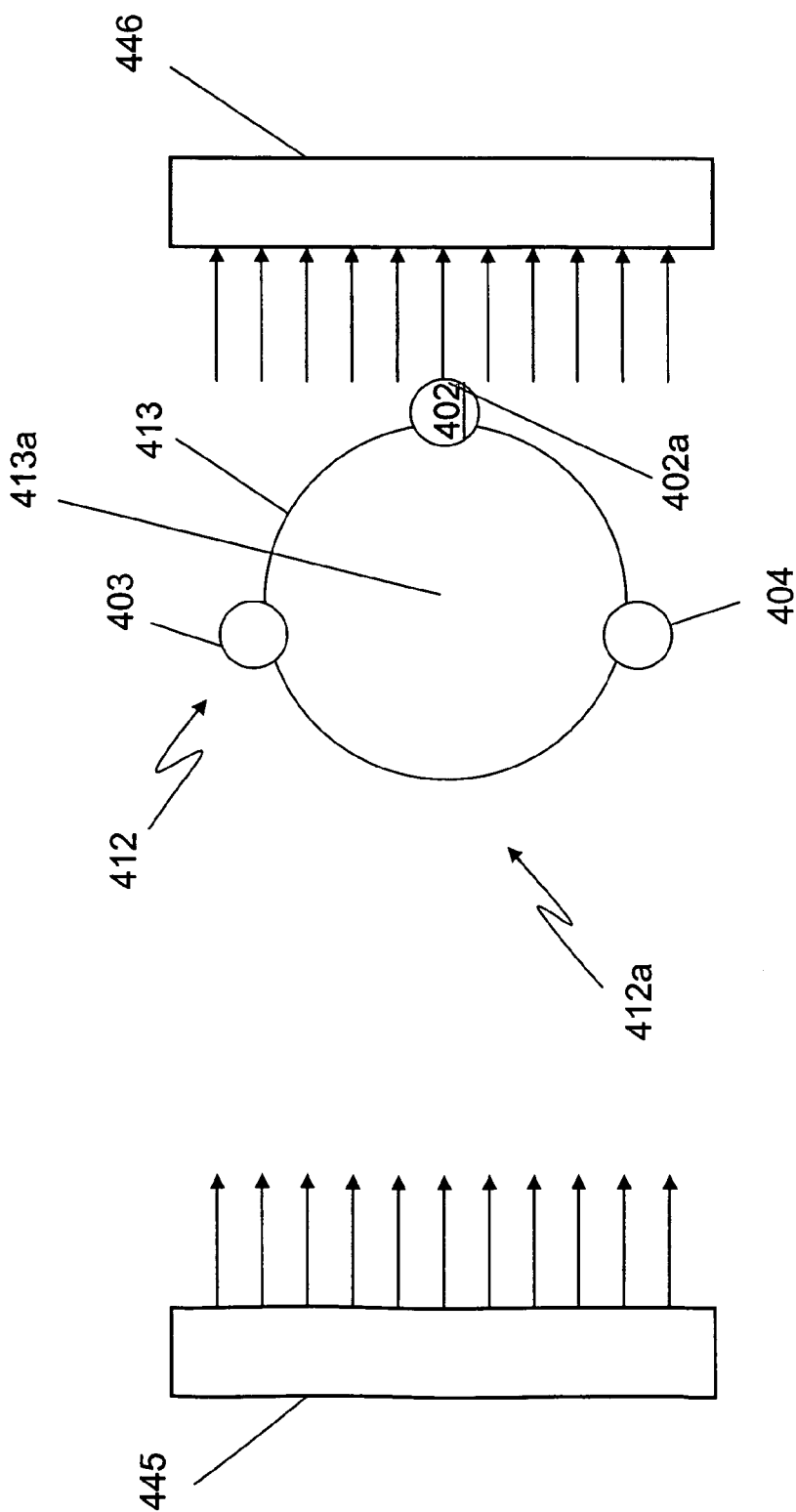
FIG. 4A shows a schematic plan view of a wafer handling chamber with a source of gas flow, a gas intake plenum and a wafer boat therebetween, in accordance with some preferred embodiments of the invention.
Figure 4B:
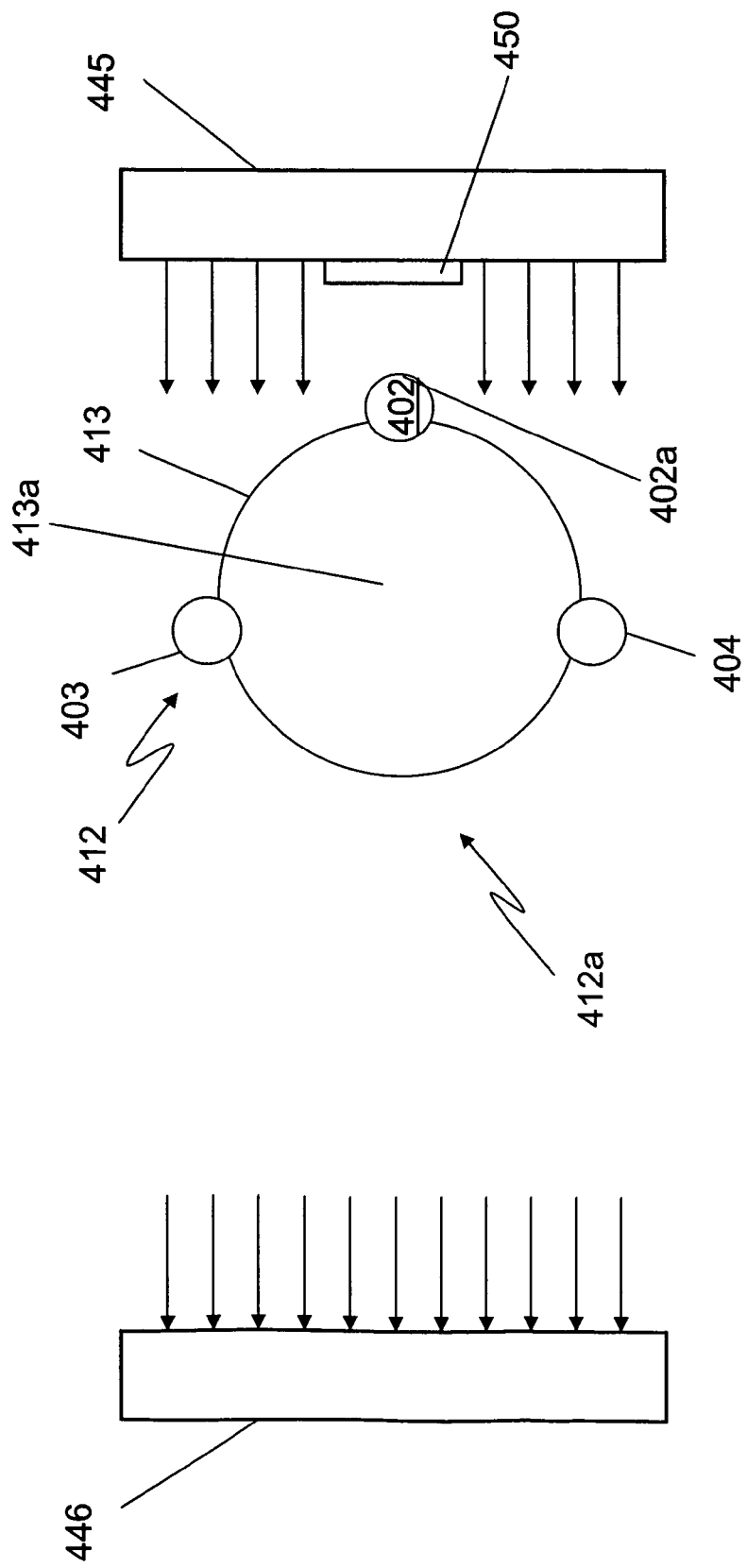
FIG. 4B shows a schematic plan view of a wafer handling chamber with a source of gas flow, a gas intake plenum and a wafer boat therebetween, in accordance with other preferred embodiments of the invention using a flow obstructer.
Figure 4C:
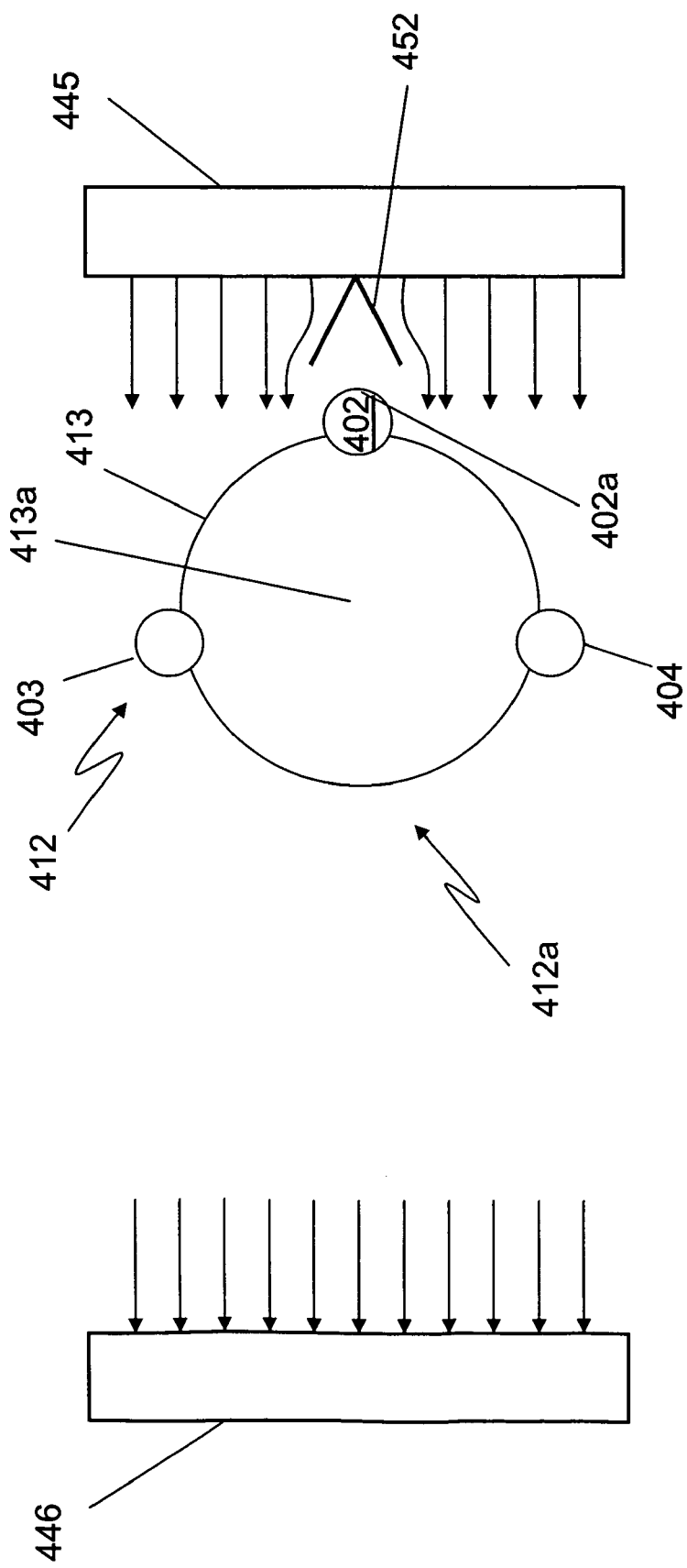
FIG. 4C shows a schematic plan view of a wafer handling chamber with a source of gas flow, a gas intake plenum and a wafer boat therebetween, in accordance with yet other preferred embodiments of the invention using a flow deflector.

Reference will now be made to FIGS. 4A-4C, in which like numerals refer to like parts throughout. Various embodiments of the invention are shown in FIGS. 4A-4C. These figures show a gas flow source 445, a gas intake plenum 446 and a wafer boat 412 holding a wafer 413. The boat 412 comprises a back boat rod 402 and side boat rods 403, 404 and has an open side 412a of the wafer boat. The back boat rod 402 has a backside 402a opposite the open side 412a. The gas flow source 445, the back boat rod 402 and a central area 413a of the surface of the wafer 413 are aligned.

Preferably, the gas flow source 445, the gas intake plenum 446 and the wafer boat 412 are disposed within a wafer handling chamber (e.g., the chamber 22 in FIG. 3) for loading wafers into boats prior to loading the wafers into a batch furnace (e.g., the furnaces 6 and 7 of FIG. 3). The gas flow source 445 can be a typical HEPA filter unit, which advantageously utilizes and expels the already present, typically inert gas of the process system housing, or can be another source of a flow of gas (e.g., an outlet for an inert purge gas, such as $N_2$, from an inert gas container). The gas intake plenum 446 can be any device to remove gas discharged by the gas flow source 445 from the volume, e.g., a wafer handling chamber, in which the wafer boat 412 is disposed. While not shown, it will be understood that a wafer handling robot for loading wafers into the boat 412 will be in position to reach the boat 412 from the open side 412a of the boat 412, opposite to that of the illustrated back boat rod 402.

With reference to FIG. 4A, an advantageously simple embodiment is shown. The open side 412a of the wafer boat 412 faces the gas flow source 445, preferably including a filter such as a HEPA filter, so that there is no boat rod on the upstream side of the wafer 413. On the down stream side, the gas (e.g., filtered gas) is exhausted through the intake plenum 446.

Although this solution is advantageously simple, it will be appreciated that the wafer handling robot (not shown), typically positioned at the open side 412a for access to the wafer 413, is now on the upstream side of the wafer 413. Any particles emitted by the wafer handling robot will now be blown in the direction of the wafer 413. It will be appreciated that concerns about particles have been regarded as particularly problematic with respect to moving parts, such as wafer handling robots, since the movement of the robots can generate particles. To guard against contamination of wafer surfaces with these particles, it has been common practice to position moving parts downstream of wafers. Without being limited by theory, it has been found, however, that boat rods may be the greater source of contamination, such that the level of particles blown from the wafer handling robot to the wafer is still less than that which may be blown from the boat rods to the wafer. Moreover, particle generation upstream of the wafer can be minimized by the use of modern high quality robots.

With reference to FIG. 4B the relative orientation of various parts and the gas flow is similar to that of FIG. 3 and reversed relative to FIG. 4A. The back boat rod 402 is now positioned upstream of the wafer 413. A flow deflector 450 obstructs the gas flow which would otherwise emanate from the part of the gas flow source 445 aimed directly towards the boat rod 402 and the central area 413a of the wafer 413. Without the deflector, flow originating from this part of the HEPA filter would directly hit the back boat rod 402, thereby loosening particles and transporting the particles to the interior part 413a of the wafer 413. The flow deflector 450 deflects the flow away from the back boat rod 402, to prevent or minimize such particle loosening or transporting.

With reference to FIG. 4C, another design with a flow deflector is shown. A flow deflector 452 redirects the gas flow from the part of the gas flow source 445 directly facing the back rod 402 in one or more directions away from the back rod 402. In the illustrated embodiment, the deflector 452 has a V shape to deflect gas in two different directions. It will be appreciated that while the flow deflector 450 of FIG. 4B preferably blocks a part of the gas flow, the flow deflector 452 of FIG. 4C preferably principally changes the direction of the flow, rather than substantially completely blocking it.

Thus, it may be said that the gas flows illustrated in FIGS. 4B-4C do not directly, or avoid, contacting the back boat rod 402, since the part of the gas flow in the direction of the back boat rod 402 is cut off or deflected before it can reach the back boat rod 402. In such a case, however, it will be appreciated that a minimal amount of gas from the gas flow source 445 may still reach the back boat rod 402, due, e.g., to turbulence. In addition, in FIGS. 4A-4C, it may also be said that the backside 402a of the boat rod 402 is not directly contacted by the gas flow, since the backside 402a does not face a direct flow of gas from the gas flow source 445, although, again, a minimal amount of gas may reach the backside 402a due, e.g., to turbulence.

In some embodiments, the direction of the gas flow shown in FIGS. 2 and 4B-4C can be retained without using a deflector and while still reducing particle formation. For example, the gas (e.g., filtered inert gas) flow velocity can be reduced to a low value to avoid blowing off particles from the boat rod. Preferably, the flow velocity is reduced to below about 0.1 m/s.

Alternatively, the gas flow velocity can be increased to a sufficiently high value that any particles which are blown off from the back rod 402 are not able to fall to the surface of the wafer 413. Preferably, the flow velocity is increased to a value above about 0.5 m/s, more preferably above about 0.6 m/s. This high gas flow velocity can be achieved with commercially available gas flow sources, such as HEPA filter units. In such a case, the gas velocity is preferably between about 0.6 and about 1 m/s.

In other arrangements, one or more additional blow-off units, or gas flow sources, in addition to the gas flow units of FIGS. 4A-4C, can be provided to direct gas flow particularly to a boat rod, e.g., a black boat rod. Such additional blow-off units could blow gas at high speed against the boat rod 402 through, e.g., an obstruction having a vertical, narrow slit which limits the gas flow such that the gas flow principally contacts the boat rod 402. The slit and resulting flow through the slit preferably extend over the entire height of the boat rod. For example, the slit can have a height similar to the boat rod. The high gas velocity can be applied during only part of the time to blow off the particles and then reduced to a value below about 0.5 m/s. Advantageously, the high gas velocity strips and cleans the boat rod of particles, but is sufficiently high to prevent the particles from settling on the wafer surface.

It will be appreciated that, even if the blowing off of particles from a boat is prevented, as described herein, it has been found that, after a limited number of process runs, the general particle level on wafers processed in a process chamber can increase, even while streak-like particle patterns on the wafers are avoided. To keep the particle level consistently low, the walls of the process chamber, e.g., the process tube delimiting the process chamber, can be subjected, after each deposition run, to a thermal shock run in which the process chamber is subjected to a large temperature change in a short time. In such a thermal shock run, the furnace has such a low temperature set point that it is effectively switched off and an empty wafer boat is elevated at high speed into the furnace, which results in a temperature drop of the furnace to about 500° C. or less. Without being bound by theory, it is believed that the thermal shock induces relaxation of the stress in and causes cracking of the films, e.g., silicon nitride films, deposited on the inner surface of the process tube during the deposition runs. This generates particles but, as the wafer boat is empty, wafers are not contaminated by these particles. The particles are exhausted by flowing a purge gas and/or by evacuation of the process tube. Thus, particles that may have otherwise been available to contaminate wafers are removed from the process chamber.

Subjecting the process tube to a thermal shock treatment after each deposition run is time consuming and can reduce the throughput of the processing system. Advantageously, it has been found that a thermal shock treatment does not need to be performed after every deposition run to achieve the beneficial results noted above. Rather, a number of deposition runs can be performed before the particle level jumps to unacceptably high values. Without being limited by theory, it is believed that multiple runs can be performed before enough stress builds-up in films deposited on the chamber walls to cause spontaneous cracking and to generate particles. The number of runs that can be performed before this spontaneous cracking occurs can be determined and the thermal shock can be performed after that number of runs is reached. The number of runs depends on the deposited thickness per run and other process conditions. In some cases, the threshold is reached after a cumulative deposited thickness of about 4000-5000 Å, after which the particle level starts to increase. This means that for a thickness per run of, e.g., about 1200 Å, a thermal shock run can be applied after 3-4 deposition runs. Advantageously, performing multiple deposition runs between the thermal shocks will minimize the impact of the thermal shocks on the throughput of the system.

To regulate the application of the thermal shock, a controller of a furnace processing system can be provided with a "software switch" functionality. The "software switch" functionality can include: (i) allowing the setting of a predefined number of runs, (ii) counting the number of deposition runs performed in a process tube; (iii) automatically performing a thermal shock run when the number of deposition runs performed is equal to the set predefined number of runs; and (iv) resetting the number of runs performed in the process tube. Advantageously, the software switch allows the thermal shock treatment to be performed automatically, with minimum impact on the throughput of the system and avoiding operator mistakes.

Such a software switch can advantageously be applied to a system that allows processing with multiple boats, such as the A412™ furnace system described herein, which allows for two boat processing. Dual boat operation is typically performed as follows: during processing of a first boat in the furnace, a second boat is loaded with wafers; after removing the processed first boat from the process tube, the second boat, loaded with wafers, is immediately loaded into the process tube for the following deposition. Performing a thermal shock run after each deposition run would interfere with the dual boat operation described above, since, e.g., the second wafer boat, loaded with wafers, cannot be immediately loaded into the process chamber. Advantageously, the software switch largely restores the dual boat capability again, since many runs can be performed between thermal shocks and since, e.g., process steps, such as wafer loading and unloading, can be performed with the first boat while the second boat in used in the thermal shock.

It will be appreciated that variations of the illustrated embodiments are possible. For example, the wafer boat can have more than three boat rods. In that case and where flow deflectors are used, the back boat rods can each be matched with a flow deflector or a single large flow deflector covering all back boat rods can be used. For example, where the wafer boat includes four rods, with two back rods facing the gas flow source, two flow deflectors or flow obstructers can be used, one for each boat rod facing the gas flow source. Further, the principles taught herein can be applied to the processing of substantially planar substrates other than semiconductor wafers. Thus, it will be appreciated that the word "wafer" can include these other substrates, which can include, but are not limited to, substrates for flat panel displays, magnetic media and optical devices, which can have any shape, including being circular, rectangular or square. Moreover, the term "wafer boat" will be understood to encompass substrate holders having a design similar to the design of the illustrated wafer boat. The substrate holders can be, e.g., sized and shaped to fit any of the various substrates discussed above. Also, while illustrated with rods having circular horizontal cross-sections, it will be appreciated that the boat rods can have horizontal cross-sections of any shape and, moreover, can be any vertically-extending wafer boat structure which extends perpendicular to a major face of substrates loaded into the wafer boat. Preferably, as illustrated, the vertically-extending structure includes support structures for supporting substrates in the wafer boat.

In addition, the gas flow can be at an angle from that illustrated in FIGS. 4A-4C. For example, with reference to FIG. 4A, the gas flow can be at an angle from that shown, with care preferably taken, however, to prevent blowing significant amounts of particles from the side rods 403, 404 onto the surface of the wafer 413.

Moreover, the gas flow sources can be large, unitary devices, or a combination of smaller devices. For example, multiple relatively small gas flow sources, e.g., multiple HEPA filter units, can be used to form a larger aggregate gas flow source extending the height of a wafer boat. In addition, rather than using a deflector to prevent the flow of gas to a back boat rod, multiple, e.g., a pair, of spaced gas flow sources can be used. The space or spaces between the gas flow sources can be aligned with one or more back boat rods, such that gas flow from the gas sources is not aimed directly at the back boat rods. In addition, rather than a deflector to redirect the gas flow from a gas flow source away from the back boat rod, as illustrated in FIG. 4C, the outlet of the gas flow source can be angled, so that gas flows out of the outlet away from the back boat rod at two different angles. Where multiple smaller gas flow sources are used, e.g., two gas flow sources, each gas flow source can be set to provide gas at a different angle relative to the back boat rod.

Accordingly, it will be appreciated by those skilled in the art that various omissions, additions and modifications can be made to the processes described above without departing from the scope of the invention, and all such modifications and changes are intended to fall within the scope of the invention, as defined by the appended claims.

We claim:

1. A method for semiconductor processing, comprising: providing a wafer boat holding a plurality of substrates in a wafer handling chamber and outside of a deposition reactor, wherein the wafer boat has an open side for loading or unloading substrates from the wafer boat and wherein the wafer boat comprises a back boat rod opposite the open side, the back boat rod having a backside on a side of the boat rod opposite the open side; providing a gas flow source detached from the wafer boat; loading substrates into or unloading substrates from the wafer boat in the wafer handling chamber; and flowing gas from the gas flow source to the wafer boat while loading or unloading substrates from the wafer boat, wherein the gas flow avoids directly contacting the backside of the back boat rod.

2. The method of claim 1, wherein flowing gas comprises flowing the gas past the open side to the back boat rod.

3. The method of claim 2, wherein flowing gas comprises flowing the gas past a wafer handler to the open side in a direction of the back boat rod.

4. The method of claim 1, wherein flowing gas comprises flowing the gas past the back boat rod to the open side.

5. The method of claim 4, wherein flowing gas comprises blocking a part of the gas flow set in a direction directly towards the back boat rod.

6. The method of claim 4, wherein flowing gas comprises flowing at least a part of the gas flow in a direction away from the back boat rod.

7. The method of claim 6, wherein flowing gas comprises flowing the part of the gas flow in two different directions away from the back boat rod.

8. The method of claim 6, wherein flowing gas comprises flowing the gas flow into a deflector to direct the part of the gas flow in the direction away from the back boat rod.

9. The method of claim 1, wherein flowing gas comprises emitting gas from a single flow generating device.

10. The method of claim 9, wherein the flow generating device is a HEPA filter.

11. The method of claim 1, further comprising providing an other gas flow to the back boat rod.

12. The method of claim 11, wherein providing the other gas flow comprises flowing gas through a slit to direct the gas flow substantially only onto the back boat rod.

13. The method of claim 11, wherein the other gas flow has a velocity of about 0.6 m/s or higher.

14. The method of claim 13, further comprising reducing the velocity to below about 0.5 m/s after flowing the other gas flow at about 0.6 m/s or higher for a desired duration.

15. The method of claim 1, wherein the substrate is a semiconductor wafer.

16. The method of claim 1, further comprising: depositing a film on each of the substrates in the wafer boat, wherein the wafer boat is disposed in a process chamber of the deposition reactor while depositing the film; removing the wafer boat from the process chamber before flowing gas to the wafer boat; and subjecting the process chamber to a thermal shock after removing the wafer boat.

17. The method of claim 16, wherein subjecting the process chamber to the thermal shock comprises reducing a temperature of the process chamber from a deposition temperature to about 500° C. or less in less than about a time required to load a wafer boat into the process chamber from a loading position beneath the process chamber.

18. The method of claim 16, wherein subjecting the process chamber to the thermal shock comprises inserting an empty wafer boat into the process chamber.

19. The method of claim 18, wherein subjecting the process chamber to the thermal shock further comprises substantially turning off heating power to the process chamber.

20. The method of claim 16, wherein depositing the film and removing the wafer boat comprises a deposition cycle, wherein multiple deposition cycles are performed before subjecting the process chamber to the thermal shock.

21. The method of claim 20, wherein performing the multiple deposition cycles comprises depositing a layer of material about 4000-5000 Å thick before subjecting the process chamber to the thermal shock.

22. The method of claim 20, further comprising automatically monitoring the number of deposition runs and regulating application of the thermal shock using a controller, wherein the controller is configured to: allow setting of a predefined number of runs, count a number of the deposition runs performed in the process tube; initiate subjecting the process chamber to the thermal shock when the number of deposition runs performed is equal to the set predefined number of runs; and reset the number of runs performed in the process chamber after subjecting the process chamber to the thermal shock.

* * * * *

UNITED STATES PATENT AND TRADEMARK OFFICE
CERTIFICATE OF CORRECTION

PATENT NO. : 7,553,516 B2 Page 1 of 1
APPLICATION NO. : 11/305826
DATED : June 30, 2009
INVENTOR(S) : Selen et al.

It is certified that error appears in the above-identified patent and that said Letters Patent is hereby corrected as shown below:

In page 2, Col. 2, line 41, under "Other Publications," please change "hetrostructures" to --heterostructures--.

In Col. 2, line 34 (approx..), after "higher" please insert --.--

In Col. 2, line 62 (approx..), after "m/s" please insert --.--.

In Col. 7, line 45, please change "black" to --back--.

Signed and Sealed this

Twenty-fourth Day of November, 2009

David J. Kappos
*Director of the United States Patent and Trademark Office*